(12) United States Patent
Garcia

(10) Patent No.: US 8,448,306 B2
(45) Date of Patent: May 28, 2013

(54) TOOL ACCESSORY FOR MULTIMETER PROBES

(76) Inventor: Ernesto Garcia, Alexandria, VA (US)

(*) Notice: Subject to any disclaimer, the term of this patent is extended or adjusted under 35 U.S.C. 154(b) by 152 days.

(21) Appl. No.: 12/957,395

(22) Filed: Dec. 1, 2010

(65) Prior Publication Data

US 2012/0141191 A1  Jun. 7, 2012

(51) Int. Cl.
*F16B 2/10* (2006.01)
(52) U.S. Cl.
USPC ............. 24/505; 24/339; 324/754.02; 403/83
(58) Field of Classification Search
USPC ................ 24/336, 339, 502, 503, 505, 513, 24/515, 517, 501, 508, 511; 403/83–85, 100, 403/91, 92; 294/16, 99.2; 324/754.02
See application file for complete search history.

(56) References Cited

U.S. PATENT DOCUMENTS

| | | | |
|---|---|---|---|
| 2,768,856 A | 10/1956 | Wright | |
| 4,112,951 A * | 9/1978 | Hulka et al. | 128/831 |
| 5,199,756 A | 4/1993 | Bartlett et al. | |
| 5,301,393 A * | 4/1994 | Brown | 24/67.7 |
| 6,056,338 A | 5/2000 | Kerr | |
| 6,089,631 A | 7/2000 | Thurlow et al. | |
| 2008/0074125 A1 | 3/2008 | Saulnier et al. | |

FOREIGN PATENT DOCUMENTS

DE  202005002531 U1  6/2005

* cited by examiner

*Primary Examiner* — James Brittain

(57) ABSTRACT

A tool accessory (10) for clamping a pair of multimeter probes allowing the probes to pivot relative to each other or separate from each other to be used separately for testing electrical components. The tool accessory (10) behaves as a pair tweezers. The tool accessory (10) utilizes a lock (16) that adjusts the angle of the probes. The lock (16) also biases the probes via pushing a pair of legs (12, 14) of the tool accessory (10).

15 Claims, 3 Drawing Sheets

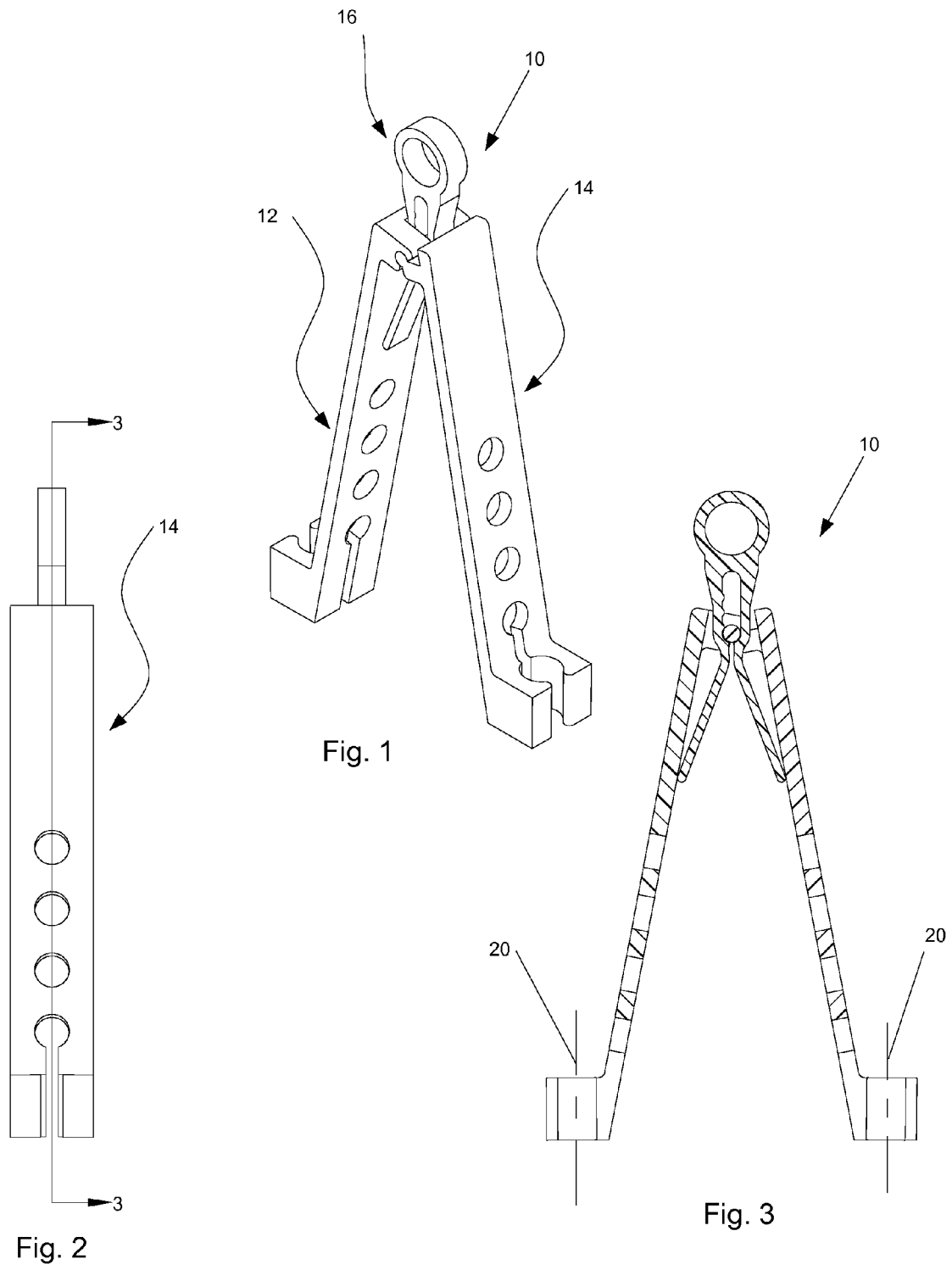

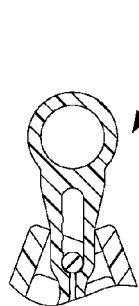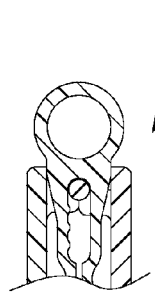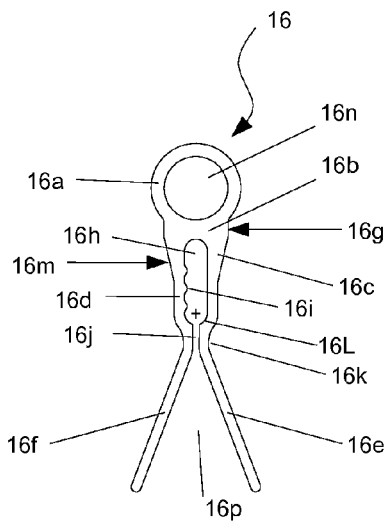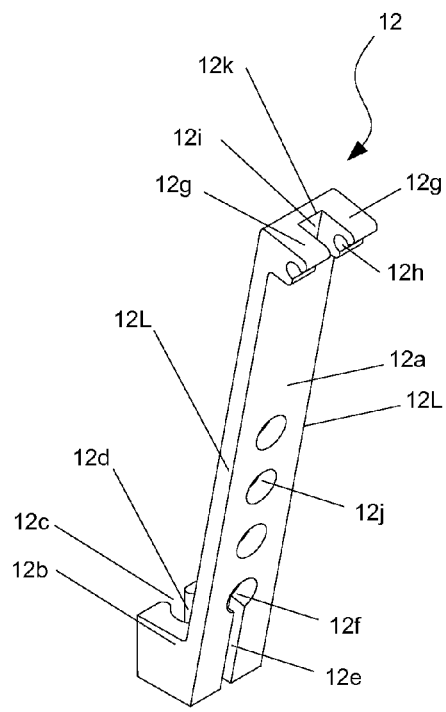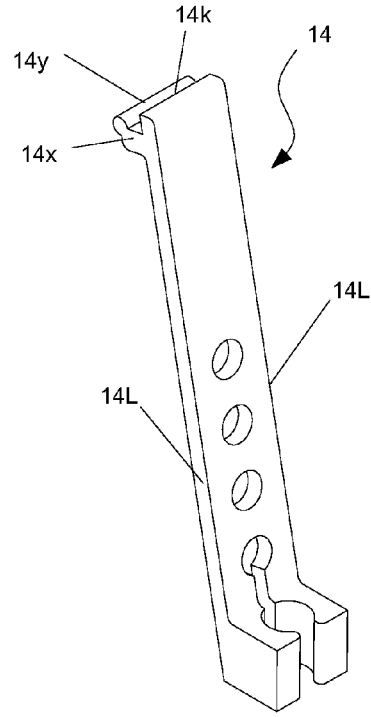
Fig. 3a
Fig. 3b
Fig. 4
Fig. 5
Fig. 6

TOOL ACCESSORY FOR MULTIMETER PROBES

TECHNICAL FIELD

The tool accessory pertains to holding a pair of multimeter probes to make them act as tweezers which facilitates the use of one hand to do testing or measuring electrical components.

BACKGROUND OF THE INVENTION

A well known multimeter contains tweezers that stick out from the multimeter. The tweezers are integrated to the multimeter such that a user just tweezes a pair of legs to measure electrical components. This known multimeter is limited in that the tweezers do not separate from each other nor do the angle are adjustable.

Others have actually separated the tweezers from the integrated multimeter thus resembling a U-shaped accessory with cables attached to the tweezers. This requires another set of cables from those of the regular lead probes and requires switching the regular probes over the tweezers thus time consuming.

SUMMARY OF THE INVENTION

The present invention is a tool accessory for multimeter probes. The tool allows the pair of probes to be pivotal relative to each other or detachable from each other. The tool accessory employs a lock that biases the probes thus acting as tweezers. The lock further allows a pair of legs of the accessory to lock at different angles relative to each other. Although set forth for multimeter probes, the usage is not limited. The tool can be used to anything that can be held or clamped down.

BRIEF DESCRIPTION OF THE DRAWINGS

FIG. 1 shows an isometric view of the assembled tool accessory.

FIG. 2 shows a front view of the tool accessory.

FIG. 3 shows a side view of the tool accessory.

FIG. 3a shows a partial section of the assembly showing a lock in a first position.

FIG. 3b shows a partial section of the assembly showing the lock in a second position.

FIG. 4 shows a front vie of the lock used in the tool accessory.

FIG. 5 shows an isometric view of left leg of the tool accessory.

FIG. 6 shows an isometric view of the right leg of the tool accessory.

DETAILED DESCRIPTION

Figure 7:
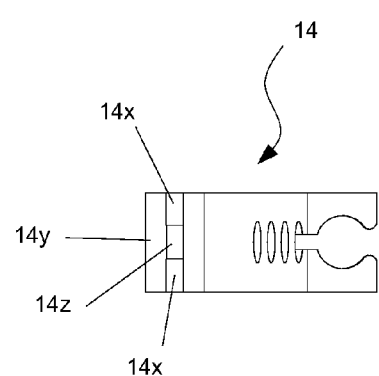
FIG. 7 shows a top view of the right leg of the tool accessory.

FIG. 1 shows an assembled tool accessory 10 comprising a left leg or first leg 12 and a right leg or second leg 14. The left leg and the right leg 14 are pivotally connected with each other and biased via a lock 16. The left leg 12 is snapped-in to the right leg 14 via an opened arcuate socket 12h connecting with an arcuate pivot shaft 14y. FIG. 5 shows the left leg 12 comprising an elongated body 12a. The body 12a comprises a pair of clamping jaws 12b at one end and a pair of forks 12g separated by a space 12i. The elongated optionally contains a series of weight reducers 12j and a stress hole 12f. The stress hole 12f is continuous with a slot 12e formed in the left leg 12 thus allowing the jaws 12b to flex outwardly and accommodate different diameter probes. The pair of jaws 12b are separated by a slot 12c blending with a probe opening 12d. The slot 12c allows an electrical cable that runs from a multimeter probe to be inserted so that the probe can slide in the probe opening 12d. Features 12a-12f and 12j found in the left leg 12 should be noted to be present in the right leg 14 thus making the legs 12, 14 partially symmetrical, see FIG. 6. FIG. 5 further shows the pair of forks 12g containing each the opened arcuate socket 12h forming an arc greater than 180 degrees and less than 270 degrees to provide a snap-in pivotable connection with. The left leg 12 has a pair of parallel side edges 12L that are coaxial with a pair of parallel edges 14L in the right leg 14.

FIG. 4 shows the lock 16 comprising a holder 16a, a first section 16b, a second section 16c and a third section 16d. The holder 16a allows a user to slide the lock 16 and the holder 16a is continuous with the first section 16b. The first section 16b contains at least one planar surface 16g which prevents the left leg 12 and the right leg 14 to pivot outwardly thus keeping the legs 12, 14 parallel to each other. The second section 16c comprising at least one tapered surface 16m that tapers from the first section 16b to the third section 16d. The taper surface 16m is narrow at the third section 16d. An elongated shaft opening 16h runs from the second section 16c to the third section 16d. The elongated shaft opening 16h is delimited by a pair of opposed walls of which one contains a series of spaced lock projections 16i which set the lock 16 at different fixed positions when sliding. The shaft opening 16h is continuous with a slot 16j which in turn the slot 16j is continuous with a gap 16p formed by the spring legs 16e, 16f. A pair of opposed leaf springs 16e, 16f continuously project from the third section 16d at an angle relative to the longitudinal axis of the lock 16. The leaf springs 16e, 16f each form a recess 16k having a depth relative to the outer wall of the third portion 16d. The recess 16k provides a relief to the leaf springs 16e, 16f when bent. The holder 16a has an opening 16n and sized to be bigger than the space defined between the main bodies of the left leg 12 and the right leg 14. It should be noted that the term "continuos" or "continuously" is defined as being homogenous and not a separate entity.

FIGS. 6 and 7 show the right leg 14 containing a pair of arms 14x integrally holding the arcuate pivot shaft 14y that snaps in with the arcuate socket 12h of the left leg 12 and forms an arcuate angle of 270 degrees or greater. The pair of arms 14x are separated by a space 14z which allows the leaf spring 16e or leaf spring 16f to be slid until the pivot shaft 14y penetrates into the sliding opening 16h via the slot 16j. The sliding opening 16h is dimensioned to allow the pivot shaft 14 to slide while overcoming the lock projection 16i. The sliding opening 16h is delimited by at least one stopper 16L so that the lock 16 is prevented from sliding out of the pivot shaft 14y especially when the left leg 12 and the right leg 14 are detached from each other. The leaf springs 16e, 16f bias both the right leg 12 and the left leg 14 outwardly. The outward motion of the legs 12, 14 is limited when the edge 12k or the edge 14k touches the tapered surface 16m as shown in FIG. 3a. The range of outward motion is determined by the position at which the lock 16 is placed. When the lock 16 is pushed in all the way as shown in FIG. 3b, the legs 12, 14 are prevented from pivoting outwardly as the edges 12k, 14k are stopped by at least one of the planar surfaces 16g or both planar surfaces 16g.

Figure 8:
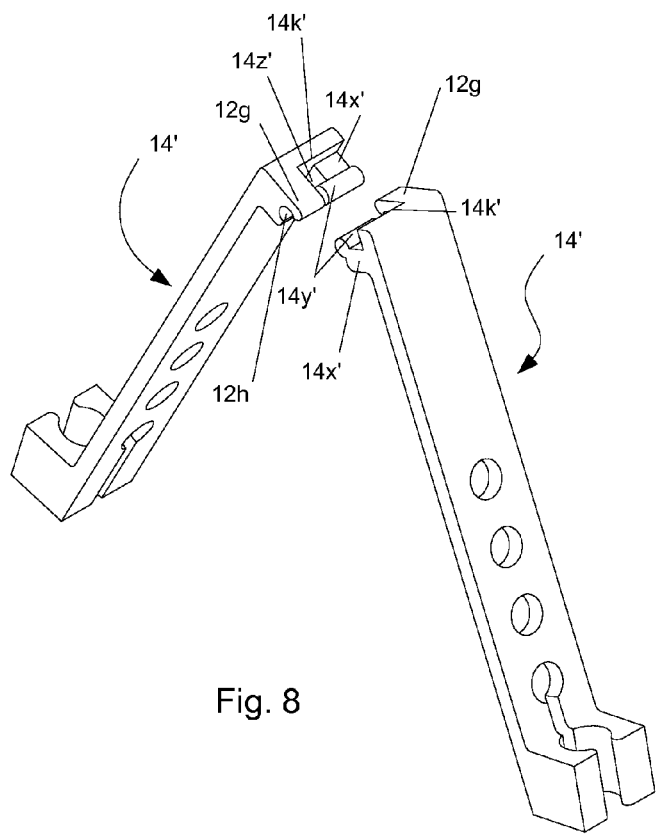
FIG. 8 shows an alternative configuration of the pivotable connection for the pair of legs.
Figure 9:
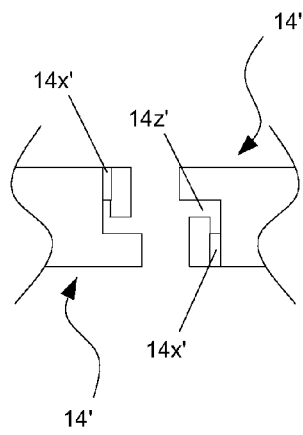
FIG. 9 shows a top view of the alternative configuration of the pivotable connection.

It should be noted that the tool accessory 10 can be made from any known material. In particular, the ideal material would be a flexible material so that the leaf springs 16e, 16f provide flexibility, repeatability, and a biasing force. Further, as seen in FIGS. 8 and 9, the left leg 14' and the right leg 14' could be made hermaphroditic having each an arcuate socket 12h and a pivot shaft 14y' which respectively snap in with the shaft 14y' and the socket 12h of the other leg. The legs 14' would also contain a fork 12g, an arm 14x', and an L-shaped gap 14z'. The arm 14x' holds a pivot shaft 14y' so that when the legs 14' are joined, the pivot shaft 14y' of one leg 14' would be coaxial to that of the other leg and snapping in with the corresponding fork 12g. In the modified legs 14' shown in FIG. 8, the edges 14k' would be stopped by the tapered surface 16m of the lock 16 thus defining the range of outward motion of the legs 14' or prevent outward motion by the planar surface 16g of the lock 16.

Other modifications would be apparent. The snap-in pivot connection disclosed could as well be replaced with offset forks in both legs and held together with a separable pivot shaft inserted in arcuate sockets or holes. The pivot shaft 14y, 14y' could as well be made shorter so that the lock 16 is not held on the pivot shaft thus not requiring lock projections 16i. The probe opening 12d, the stress hole 12f, and clamping jaws can be made from any other known shape. The body 12a although being rectangular could as well be modified to any other shape. Although the probe opening 12d extends along the axis 20 at an angle relative to the longitudinal axis of the body of the legs as shown in FIG. 2, the probe opening can extend at any angle or parallel to the longitudinal axis of the legs 12, 14. Further, the gaps 14z, 14z' could as well be formed by a mold projection extending through an opening, not shown, in the body 12a of the right leg 14, 14'.

The invention claimed is:

1. A tool accessory comprising a first leg, a second leg, a lock, and a pivotal snap-in connection between the first leg and the second leg;
   the pivotal snap-in connection comprising at least one opened socket and at least one pivot shaft; the lock being interposed between the first leg and the second leg; the lock being slidable perpendicular to the pivotal shaft and defining a longitudinal axis; and,
   the lock comprising a pair of opposed leaf springs that continuously project from an end of the lock and extend at an angle relative to the longitudinal axis of the lock to bias the first leg and the second leg;
   wherein the lock further comprises an elongated shaft opening and being continuous with a slot formed between the leaf springs; the pivot shaft being slidable in the elongated opening; and the slot being continuous with a gap defined by the leaf springs.

2. The tool accessory as defined in claim 1, wherein the lock further comprises a first portion, a second portion, and a third portion; wherein the first portion projects from a holder and comprises at least one planar surface extending parallel to the pivot shaft; the second portion comprises a tapered surface extending from the first portion and narrowing at the third portion.

3. The tool accessory as defined in claim 2, wherein the holder comprises an opening.

4. The tool accessory as defined in claim 2, wherein the leaf springs each form a recess having a depth greater than an outer wall of the third portion.

5. The tool accessory as defined in claim 4, wherein the socket is formed by a pair of forks spaced from each other and formed at the end of the first leg; the pivot shaft being connected to two arms projecting from the second leg spacing the shaft away from the second leg and forming a space between the pivot shaft and the second leg; wherein the lock is situated between the forks and the space between the pivot shaft and the second leg.

6. The tool accessory as defined in claim 5, wherein the first leg has a pair of parallel side edges that are coaxial with a pair of parallel edges in the second leg.

7. The tool accessory as defined in claim 4, wherein the first leg contains both the socket and the pivot shaft, and
   the second leg contains another socket and another pivot shaft; wherein the pivot shaft of the first leg is pivotally connected to the socket of the second leg and the pivot shaft of the second leg is pivotally connected to the socket of the first leg.

8. The tool accessory as defined in claim 7, wherein the opened sockets are each formed in a fork; the pivot shafts are each connected to an arm; wherein an L-shaped gap is formed between the arm and the fork in each leg.

9. The tool accessory as defined in claim 1, wherein the slot is narrower than a diameter of the pivot shaft.

10. The tool accessory as defined in claim 9, wherein the left leg and the right leg each comprise a longitudinal axis and a pair of opposed jaws defined by an elongated slot; wherein the elongated slot respectively extends along the longitudinal axis of the legs.

11. The tool accessory as defined in claim 10, wherein the elongated slot terminates at a stress hole.

12. The tool accessory as defined in claim 11, wherein the opposed jaws define an opening extending at an angle relative to the longitudinal axis of the legs and the elongated slot extends on opposite sides of the opening dividing the slot into two slot portions wherein one of the slot portions is longer than the other slot portion.

13. The tool accessory as defined in claim 10, wherein the opposed jaws define an opening extending at an angle relative to the longitudinal axis of the legs and the elongated slot extends on opposite sides of the opening dividing the slot into two slot portions wherein one of the slot portions is longer than the other slot portion.

14. A tool accessory comprising a first leg, a second leg, a lock, and a pivotal snap-in connection between the first leg and the second leg;
   the pivotal snap-in connection comprising at least one opened socket and at least one pivot shaft; the lock being interposed between the first leg and the second leg; the lock being slidable perpendicular to the pivotal shaft and defining a longitudinal axis; and,
   the lock comprising a pair of opposed leaf springs that continuously project from an end of the lock and extend at an angle relative to the longitudinal axis of the lock to bias the first leg and the second leg;
   wherein the elongated opening is delimited by a pair of sidewalls of which one of the sidewalls defines at least one spaced projection to position the lock at different sliding positions.

15. The tool accessory as defined in claim 14, wherein the lock further comprises a holder having a size greater than a space between the first leg and the second leg.

* * * * *